United States Patent [19]
Yang et al.

[11] Patent Number: 5,382,820
[45] Date of Patent: Jan. 17, 1995

[54] HIGH VOLTAGE CMOS DEVICE TO INTEGRATE LOW VOLTAGE CONTROLLING DEVICE

[75] Inventors: Sheng-Hsing Yang, Hsinchu; Nai-Jen Yeh, Hsin Chu County, both of Taiwan, Prov. of China

[73] Assignee: United Microelectronics Corporation, Hsinchu, Taiwan, Prov. of China

[21] Appl. No.: 162,955

[22] Filed: Dec. 8, 1993

[51] Int. Cl.⁶ .................... H01L 27/02; H01L 21/265
[52] U.S. Cl. ..................... 257/371; 257/373; 257/395; 257/506; 257/545; 437/34; 437/40; 437/63; 437/74; 437/913
[58] Field of Search ............ 257/371, 373, 376, 395, 257/545, 506; 437/34, 40, 63, 74, 913

[56] References Cited

U.S. PATENT DOCUMENTS

5,008,722  4/1991  Esquivel .......................... 257/316
5,128,739  7/1992  Shirato ............................ 257/371

OTHER PUBLICATIONS

Z. Parpia et al, "A Novel CMOS Compatible High Voltage Transistor Structure" IEEE Trans Electron Devices, vol. ED-33, pp. 1948-1952 (Dec. 1986) (reprint pp. 116-120).
R. Jayaraman et al, "Comparison of High Voltage Devices for Power Integrated Circuits," pp. IEDM 84 258-261 (1984).

*Primary Examiner*—Edward Wojciechowicz
*Attorney, Agent, or Firm*—George O. Saile; Graham S. Jones, II

[57] ABSTRACT

A method of fabrication of an semiconductor device comprises applying an impurity of a predetermined polarity to a silicon substrate; forming a well by applying an impurity of an opposite polarity to a region in the silicon substrate; forming a first masking layer on the surface of the substrate; providing openings in the masking layer and implanting dopant ions of a first polarity into the surface of the substrate in a set of first regions selected in the substrate and the well forming a second masking layer on the surface of the substrate; implanting dopant ions of a second polarity through a second mask in other regions selected in the well and the substrate; removal of the second masking layer; formation of field oxide structures over the first and second regions; forming gate oxide layers above the exposed portions of the first and second central regions; and formation of conductive gate structures over the gate oxide layers.

31 Claims, 8 Drawing Sheets

HIGH VOLTAGE CMOS DEVICE TO INTEGRATE LOW VOLTAGE CONTROLLING DEVICE

BACKGROUND OF THE INVENTION

1. Field of the Invention

This invention relates to high voltage CMOS integrated circuits/processes and more particularly to low voltage controlling devices therefor.

2. Description of Related Art

Z. Parpia et al "A Novel CMOS-Compatible High-Voltage Transistor Structure" IEEE Trans Electron Devices, Vol. ED-33, pp. 1948-1952 (December 1986) (reprint pages 116-120) describes a process wherein there is a polysilicon gate lithography alignment problem with the P− region. In LSI technology the P−well P−region is always the first step, the device channel region is in the P−well region or under the polysilicon gate, so the layout must have a longer channel to prevent the polysilicon layer misalignment form the P−well region.

R. Jayaraman et al "Comparison of High Voltage Devices for Power Integrated Circuits" pp. IEDM 84 258-261 (1984) describes a process wherein the P− implant (which is always the P−well implant is performed before the metal gate is formed. The reason that forming the gate after the P− implant is a disadvantage is that although it is the metal gate, the alignment problem remains, so the layout must have a longer channel length.

Note that in the Parpia et al and Jayaraman et al the device structures are implemented in CMOS, so the source side cannot be operated at a high voltage.

In prior art high voltage device structures, although there is an N− guard in the NMOS device, it has to be added with an additional mask. In PMOS devices, the P− well is used as the guard region by modifying the doping thereof, and the current driving capacity is limited by that modified doping of the P− well.

SUMMARY OF THE INVENTION

An object of this invention is provide a process for manufacture of CMOS devices wherein the number of masks required during the process is reduced.

An important aspect of this invention is the use of a low voltage implant of a P−field and an N−field to produce a high voltage device region (P−drift, P−isolation, N−drift, N−isolation), one can easily control the P− implant and the N− implant to meet high voltage device requirements, while eliminating the requirement for an additional mask to produce the desired results.

In accordance with this invention, a semiconductor device comprises a) an impurity of a predetermined polarity in a silicon substrate, b) a well including an impurity of an opposite polarity to the silicon substrate, c) dopant ions of a first polarity in the surface of the substrate in a set of first regions selected in the substrate and the well, d) dopant ions of a second polarity implanted in other regions selected in the well and the substrate, e) field oxide structures over the first and second regions, f)) gate oxide layers above the exposed portions of the first and second central regions, and g) conductive gate structures over the gate oxide layers, and h) a low voltage implant of a P−field and an N−field to produce a high voltage device region.

A method of fabrication of an semiconductor device in accordance with this invention comprises a) applying an impurity of a predetermined polarity to a silicon substrate, b) forming a well by applying an impurity of an opposite polarity to a region in the silicon substrate, c) forming a first masking layer on the surface of the substrate, d) providing openings in the masking layer and implanting dopant ions of a first polarity into the surface of the substrate in a set of first regions selected in the substrate and the well, e) forming a second masking layer on the surface of the substrate, f) implanting dopant ions of a second polarity through a second mask in other regions selected in the well and the substrate, g) removal of the second masking layer, h) formation of field oxide structures over the first and second regions, i) forming gate oxide layers above the exposed portions of the first and second central regions, and j) formation of conductive gate structures over the gate oxide layers.

Preferably in accordance with this invention, the conductive gate structures extend over the top of the field oxide layers juxtaposed therewith; the conductive gate structures comprise polysilicon; an N− grade region is formed after formation of the conductive gate structures; an N+ diffusion region is formed after the N− grade region; a P+ diffusion is formed after the N+ diffusion; and a contact area is formed down to the P+ diffusion.

It is also preferred in accordance with this invention that the metal is deposited into the contact area for electrical connection to the P+diffusion; the oxide is deposited, reflow is performed and densification is performed after the P+ diffusion; the contact area is formed down to the P+ diffusion, and metal is deposited into the contact area for electrical connection to the P+ diffusion.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

This invention is based upon the use of a low voltage process to overcome the problems of prior art high voltage device structures, which included an N− guard in the NMOS device, requiring an additional mask; and which for a PMOS device required the P− well to be used as the guard region, thereby limiting current driving capacity as the result of doping of the P− well used to overcome problems. In accordance with this invention, a P− field implant is used both as the high voltage NMOS device isolation region and as the high voltage PMOS device drift region for adjusting PMOS driving current. The N− field implant is also used for high voltage devices in a similar way as the P− field implant is used. Best performance is achieved by adjusting the field implant. Use is made of an LCD driver and super I/O TTL integration.

FIGS. 1–8, 9A, 10–11, 12A, 13–15 and 16A illustrate the formation of a CMOS transistor device in accordance with this invention.

Figure 8:
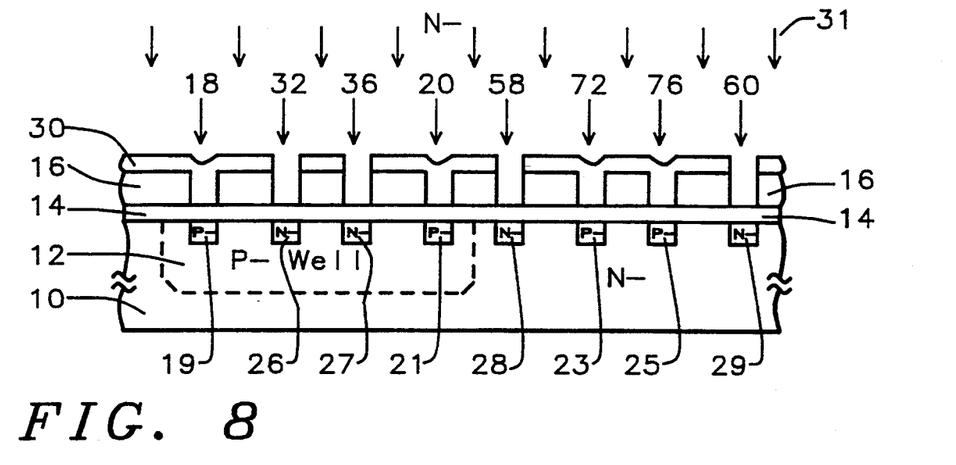
Figure 9A:
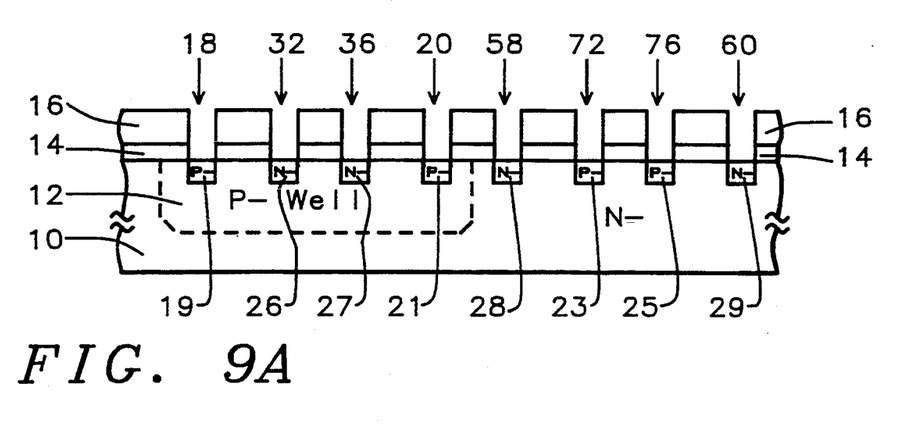
Figure 9B:
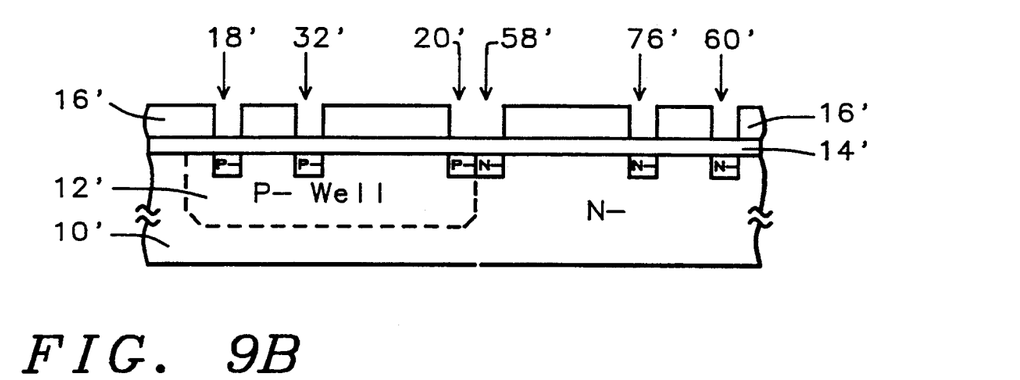
FIGS. 9B, 12B, and 16B show the key process steps for formation of the low voltage circuit in accordance with this invention.
Figure 11:
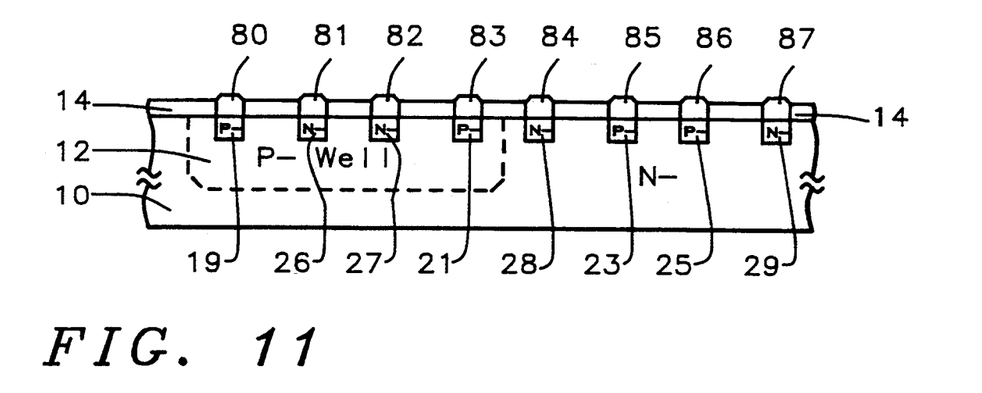
Figure 12A:
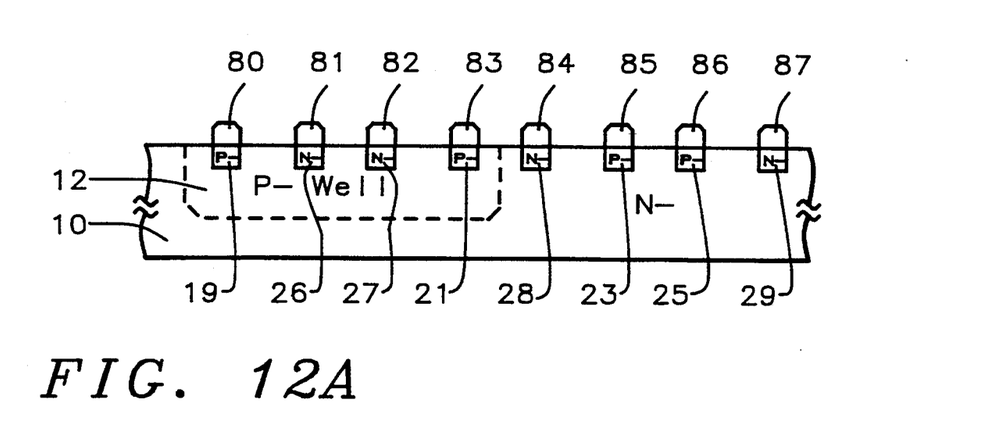
Figure 12B:
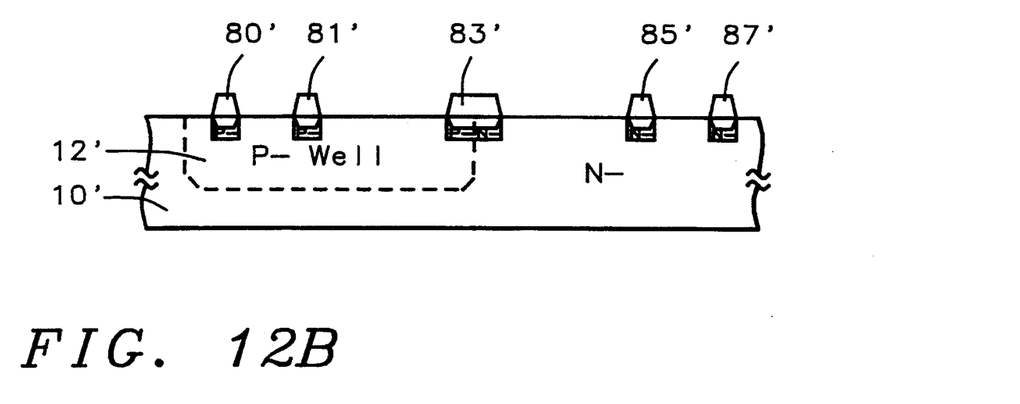
Figure 15:
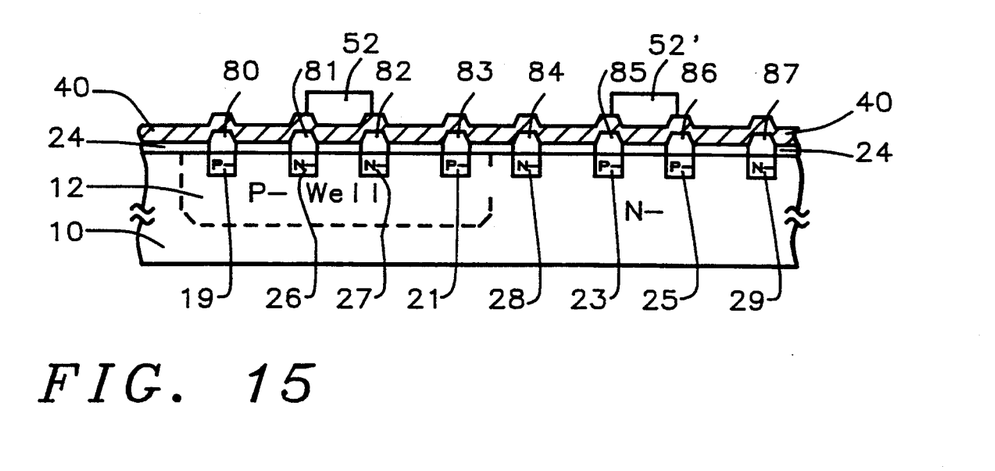
Figure 16A:
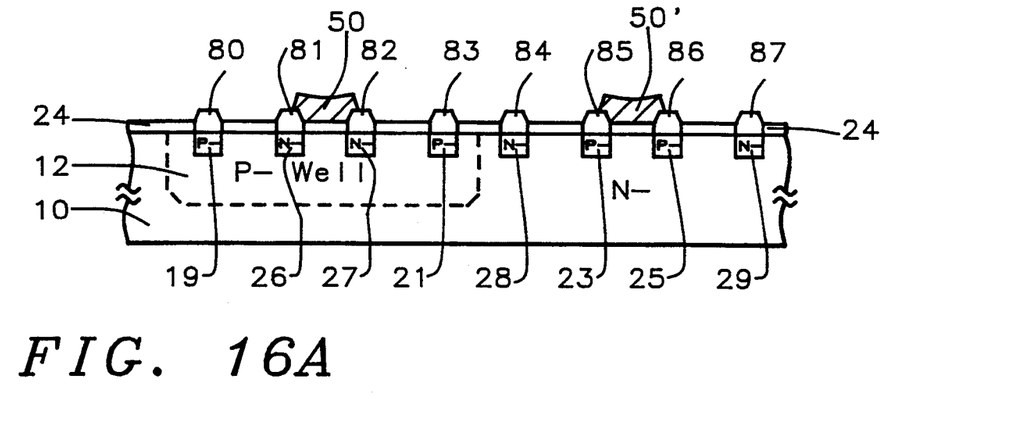
Figure 16B:
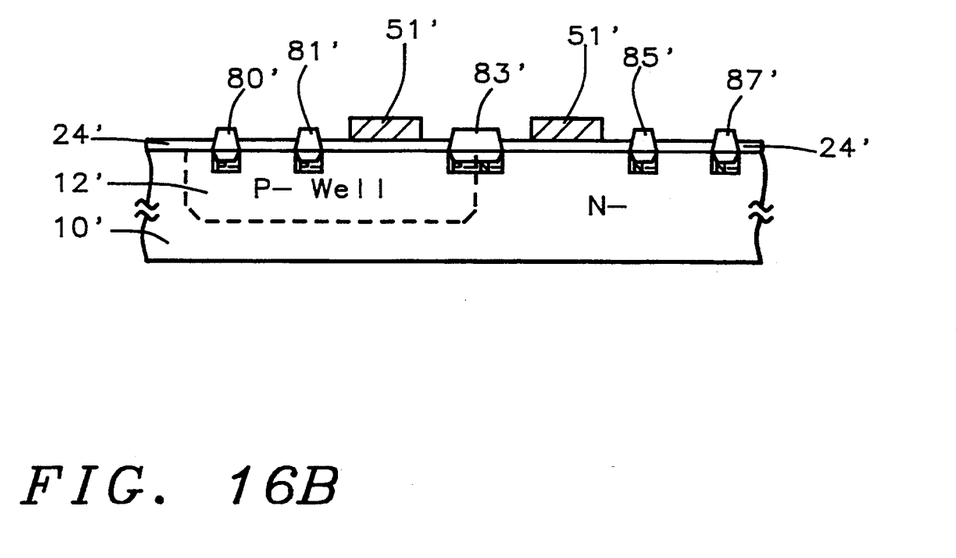

FIGS. 9B, 12B, and 16B show the key process steps for formation of the low voltage circuit in accordance with this invention. Additional process steps illustrations are omitted for the low voltage circuit since they would be redundant and the showings in FIGS. 1–8, 10–11 and 13–15 are illustrative of the process steps employed before and between the steps illustrated by FIGS. 9B, 12B, and 16B.

Figure 1:
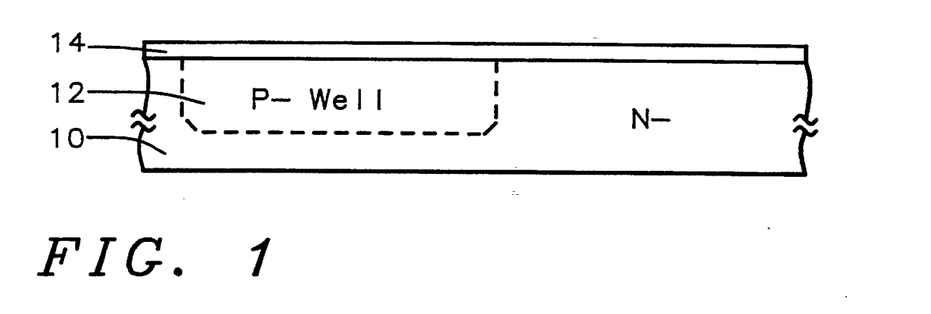
FIGS. 1-8, 9A, 10-11, 12A, 13-15 and 16A illustrate the process of formation of the high voltage CMOS portion of a CMOS transistor device in accordance with this invention.

Referring to FIG. 1, it illustrates the first stage of formation of a CMOS transistor device including semiconductor substrate 10 which has previously had impurities introduced therein providing N−sub doping. In the initial stages the substrate 10 has a silicon dioxide layer (not shown) applied thereto.

HIGH VOLTAGE PROCESS

A P− well 12 is formed in substrate 10 by means of masking and an ion implant process to apply the dose of dopant required to form a P− well.

A diffusion process is performed, i.e. a P− well drive in process. The PMOS portion of the device on the right half of FIG. 1 does not include a P− well but simply the substrate 10, and (after the next step) the silicon dioxide layer 14.

Then, in the next step, the initial silicon dioxide layer (not shown) is removed from substrate 10.

A thin base oxidation producing a base silicon dioxide ($SiO_2$) layer 14 is formed on the exposed surface of substrate 10 covering the substrate 10 and P− wells 12 also, wherever either is exposed.

Figure 2:
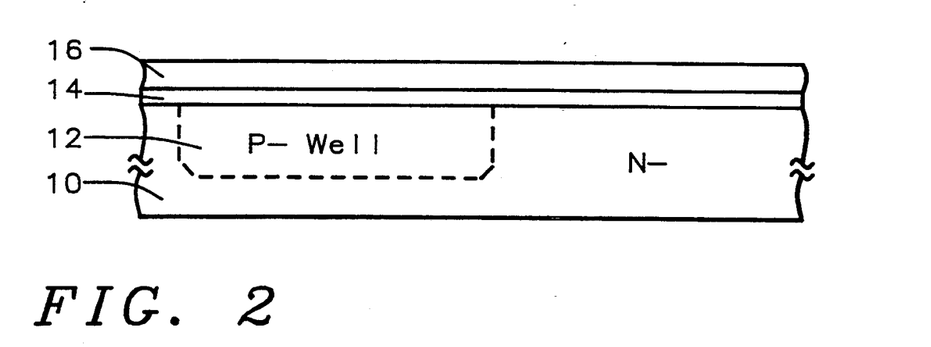

As shown in FIG. 2, the next step in the process of forming the CMOS device is that a "nitride" layer 16 consisting of silicon nitride $Si_3N_4$ is formed on the surface of the silicon dioxide base layer 14.

Subsequently, in FIG. 3 a photoresist layer 17 has been applied to the exposed surface of the nitride layer 16.

Figure 3:
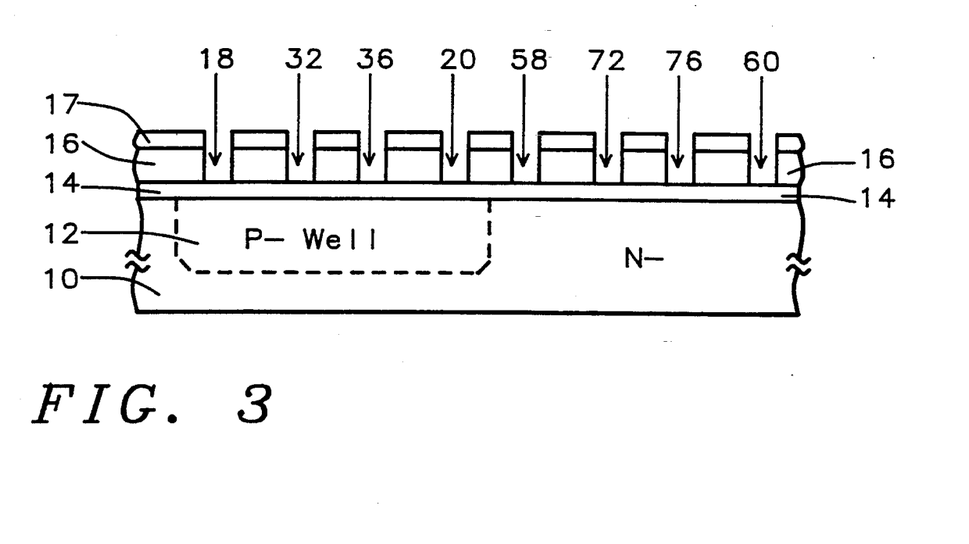

In FIG. 3 the device with photoresist layer 17 has been aligned with a mask, exposed by the mask and developed to form openings 18, 32, 36, 20, 58, 72, 76, and 60 in layer 17.

Then each of those openings is extended down through the silicon nitride layer 16 by etching through those openings in the photoresist mask 17, down to the top surface of silicon dioxide layer 14.

Next photoresist mask layer 17 is stripped away from the device of FIG. 3.

Figure 4:
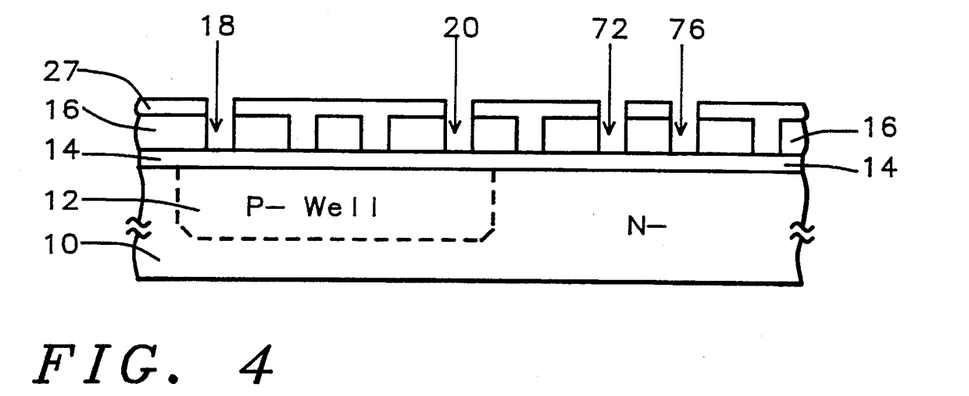

Afterwards, a new layer of photoresist 27 is applied to the product of step 3.

Figure 5:
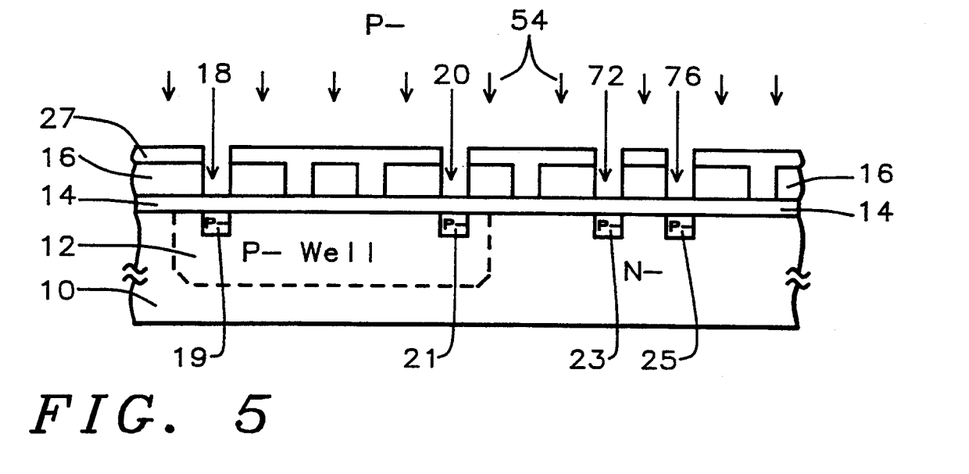

A mask is aligned and exposed to expose openings 18, 20, 72 and 76 in silicon nitride layer 16, once more, but covering openings 32, 36, 58, and 60 preparatory to the P− implantation step illustrated by FIG. 5 (including the P− type field, P− type isolation, and P− type drift region.)

Then, referring to FIG. 5, a P− ion implant is performed by ions 54 passing through openings 18, 20, 72 and 76 in FIG. 5 down into local regions 19, 21, 23, and 25 respectively in FIG. 4. The chemical species of the dopant implanted is preferably boron with a dose within a broad operable range of from about 3 E 13 atoms/cm$^2$ to about 9 E 13 atoms/cm$^2$ at an energy of from about 20 keV to about 50 keV in a high current implanter type of tool. The optimum dose is within the range of from about 3 E 13 atoms/cm$^2$ to about 9 E 13 atoms/cm$^2$, resulting in a concentration of boron dopant from about $1 \times 10^{16}$ atoms/cm$^3$ to about $8 \times 10^{16}$ atoms/cm$^3$.

Figure 6:
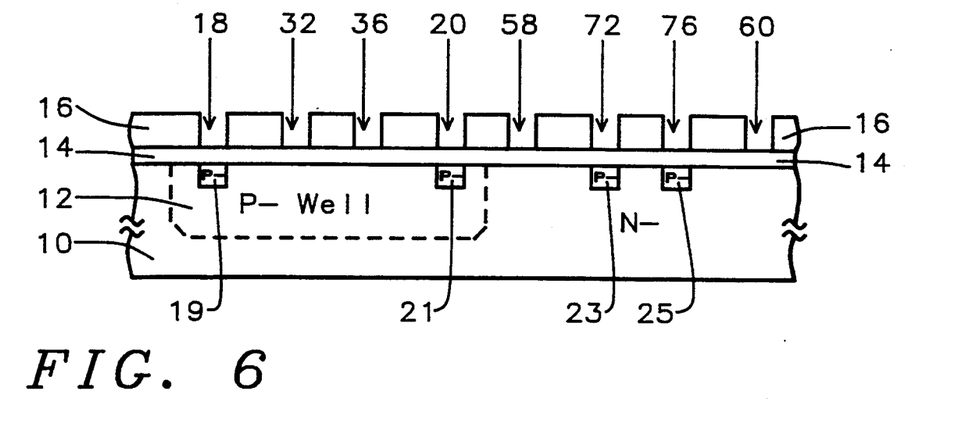

At this point the resist layer 27 is removed, as shown in FIG. 6.

Figure 7:
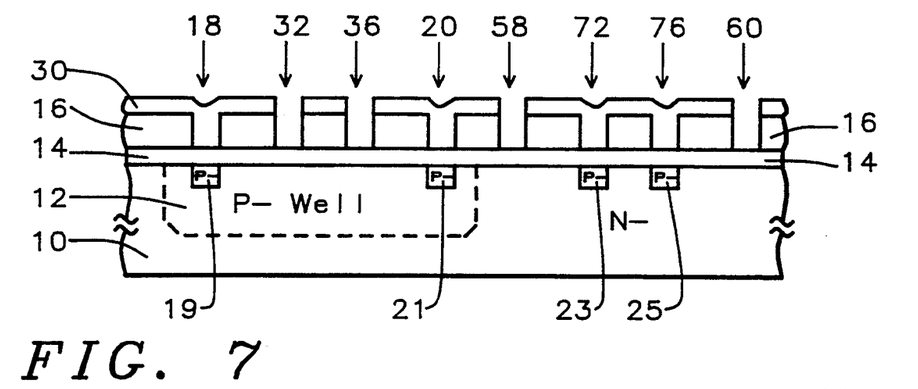

Then, referring to FIG. 7, a new coating of photoresist 30 is applied over the product of FIG. 6 after the resist layer 27 was removed.

The resist layer 30 is aligned for the N− mask and exposed through the mask. The result is openings in layer 30 including openings 32, 36, 58, and 60 shown in FIG. 7 between regions 19, 21 in P− well 12 and on either side of regions 23, and 25 respectively in the N− region of substrate 10.

Referring to FIG. 8, an N− ion implant is performed. The N− ion implant of ions 31 is performed through openings 32, 36, 58, and 60 in FIG. 8. The N− ions 31 are implanted in the regions 26, 27, 28, and 29. The chemical species of the dopant implanted is preferably phosphorous ($P^{31}$) or arsenic ($As^{75}$) with a dose within an operable range of from about 1.5 E 12 atoms/cm$^2$ to about 5.5 E 12 atoms/cm$^2$ at an energy of from about 120 keV to about 180 keV in a high current implanter type of tool, resulting in a concentration of phosphorous ($P^{31}$) or arsenic ($As^{75}$) dopant from about $1 \times 10^{15}$ atoms/cm$^3$ to about $1 \times 10^{16}$ atoms/cm$^3$.

The next step is a conventional process of removing the resist layer 30 performed, the result of which is shown in FIGS. 9A and 9B.

Figure 10:
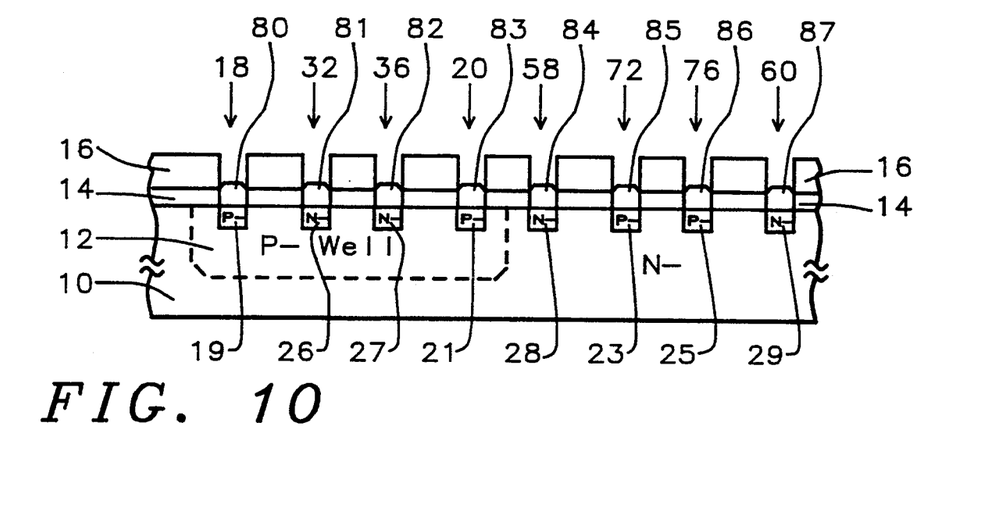

Next, a process of field oxidation is performed in a furnace. The result is a set of field oxide structures 80–87 which are formed in the openings 18, 32, 36, 20, 58, 72, 76 and 60.

Next, silicon nitride layer 16 is etched and removed leaving the product seen in FIG. 11 with the structures 80–87 extending through the silicon dioxide layer 14.

Referring to FIG. 12A and 12B, the next step is to remove the oxide structure 14.

Figure 13:
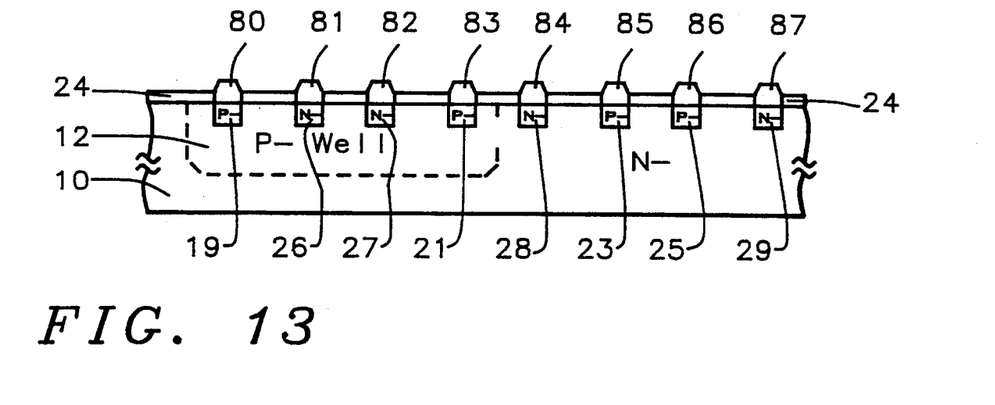

Referring to FIG. 13, a new gate oxide layer 24 is formed on the surface of the device surrounding the field oxide structures 80–87. The gate oxide layer 24 is deposited in a furnace.

Figure 14:
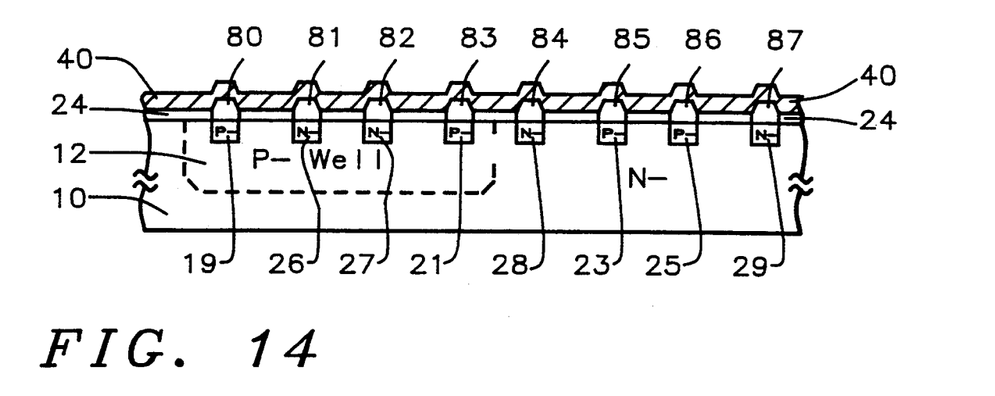

Referring to FIG. 14, a layer of polysilicon 40 is deposited upon the product of FIG. 13 in a furnace. The polysilicon 40 is intended to be formed into conductive gate structures.

Referring to FIG. 15, a photolithographic mask 52 is formed and the polysilicon is etched with the remaining mask structures 52, 52' protecting a few areas intended to be formed into conductive gates 50 and 50' between N− regions 26 and 27 and between P− regions 23 and 25. Then the exposed portions of polysilicon layer 40 is etched yielding the conductive gates 50 and 50'.

A photoresist mask (not shown) is applied to the product of FIG. 16 and an N− alignment is performed.

A layer of photoresist is applied and a mask is formed to make an N− implant of the N− grade. Then the N− implant (which is the N− grade in FIGS. 18 and 19) is performed.

Then, the photoresist is removed.

Next, the N− grade dopant is driven in.

Subsequently, a layer of photoresist is applied, aligned and an N+ mask is formed and developed.

Figure 18:
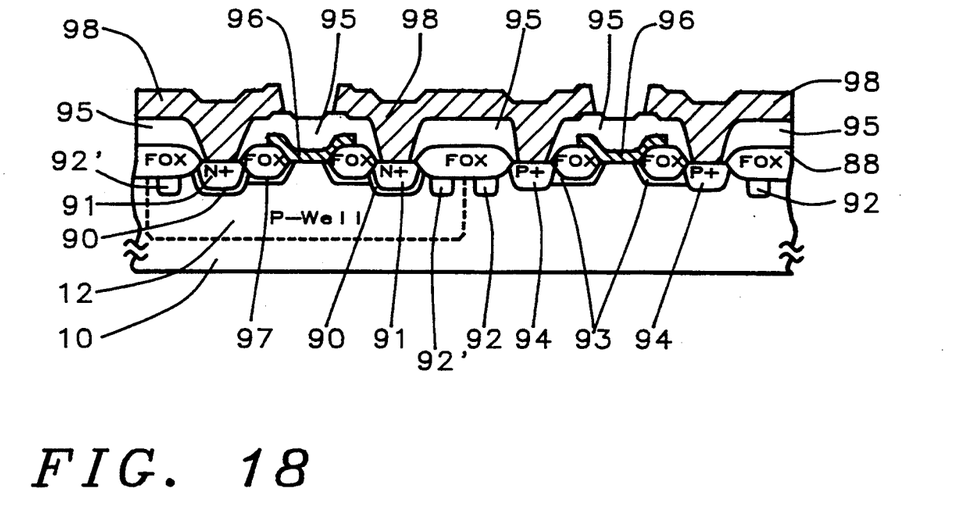
FIG. 18. shows a high voltage device in accordance with this invention wherein a substrate and a P−well have a CMOS device formed therein.

Afterwards an N+implant is performed, which is the N+diffusion region in FIG. 18.

Then, photoresist is removed.

Following photoresist removal, an N+ type drive in is performed.

A layer of photoresist is applied, aligned and an P+ mask exposure and resist development are performed.

Afterwards, a P+ diffusion is performed with a P+ type implant which is the P+ diffusion in FIG. 18.

Then photoresist is removed.

Next, a source/drain reoxidation is performed.

Afterwards, an oxide deposition is performed.

Subsequently, a reflow step is performed.

Then, a step of densifying is performed.

A contact mask resist layer is formed and alignment and exposure performed.

Afterwards, contact etching is performed through the mask. Subsequently, photoresist is removed.

Later, metal is deposited into the openings made for the contact.

Then, metal is etched by means of masking followed by application of an etchant.

LOW VOLTAGE PROCESS

The low voltage process is substantially the same as above. In FIG. 9B, the P− implants 18', 32' and 20' are shown in P− well 12'. The N− implants 58', 76' and 60' are shown in the N− substrate 10'. Note that 20' and 58' are juxtaposed in direct contact at the interface between the P−well 12' and the substrate 10'.

In FIG. 12B the device of FIG. 9B is shown with the field oxide structures 80', 81', 83', 85', and 87' above the P−implants and the N− implants after the corresponding steps to those leading up to FIG. 9A.

In FIG. 16B, the formation of polysilicon structure 51 on the surface of gate oxide 24 between structures 81' and 83' and the formation of polysilicon structure 51' between structures 85' and 83' are shown.

Figure 17:
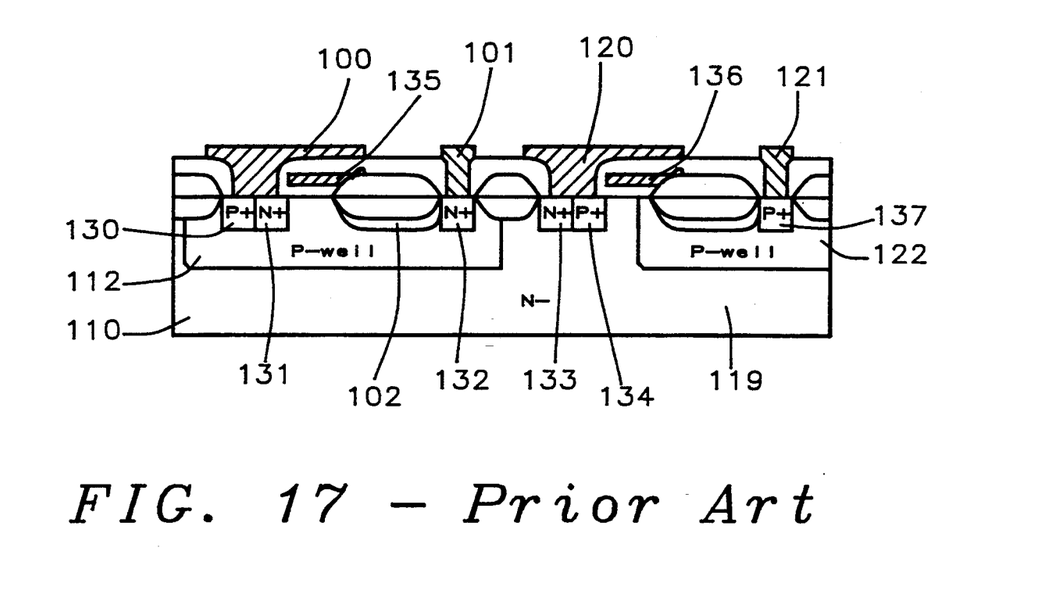
FIG. 17 shows a section of prior art device including a device with a source, a drain, a gate, and N+ region, and an N−guard in a P−well in substrate.

FIG. 17 shows a prior art device. On the left there is a section of a device with a source 100, a drain 101, a gate 135, a N+ region 132, a N−guard 102 in a P−well 112 in substrate 110. A P+ region 130 and a N+ region 131 are beneath the source 100. The other half of the device includes a N+ region 133 and a P+ region 134 beneath a source 120, a drain 121 above a P+ region 137 in P−well 122 in substrate 119, but no N−guard. There is no P Junction isolation used. The problem with the design of FIG. 17 is that the N− guard must have an additional mask to perform the process.

FIG. 18. shows a high voltage device in accordance with this invention wherein a substrate 10 and a P−well 12 have a CMOS device formed therein. The devices include the following elements with the parameters listed as indicated as follows:

| | |
|---|---|
| FOX region 88 | from about 8000Å to about 12000Å. |
| N-grade regions 90 ($P^{31}$) | from about 120 keV to about 180 keV from about $2 \times 10^{13}/cm^2$ to about $8 \times 10^{13}/cm^2$ |
| N+ diffusion regions 91, ($As^{75}$) | from about $3 \times 10^{15}/cm^2$ to about $5 \times 10^{15}/cm^2$ |
| N− isolation regions 92 ($P^{31}$ or $As^{75}$) | from about 120 keV to about 180 keV from about $1.5 \times 10^{12}/cm^2$ to about $5.5 \times 10^{12}/cm^2$. |
| P− isolation regions 92' ($B^{11}$) | from about 20 keV to about 50 keV $3 \times 10^{13}/cm^2$ to about $9 \times 10^{13}/cm^2$. |
| P-drift regions 93 ($B^{11}$) | from about 20 keV to about 50 keV $3 \times 10^{13}/cm^2$ to about $9 \times 10^{13}/cm^2$. |
| P+ regions 94 ($BF_2$) | from about 60 keV to about 100 keV from about $3 \times 10^{15}/cm^2$ to about $5 \times 10^{15}/cm^2$. |
| Oxide layer 95 | about 10,000Å. |
| Polysilicon gate 96 | from about 3,000Å to about 6,000Å |
| N− drift regions 97 ($P^{31}$ or $As^{75}$) | from about 120 keV to about 180 keV from about $1.5 \times 10^{12}/cm^2$ to about $5.5 \times 10^{12}/cm^2$ |
| metal layer 98 | about 10,000Å. |

An important aspect of this invention exemplified by FIG. 18 in contrast with the prior art shown in FIG. 17 is the use in FIG. 18 of a low voltage implant of a P−field and an N−field to produce a high voltage device region (P−drift, P−isolation, N−drift, N−isolation), one can easily control the P− implant and the N− implant to meet high voltage device requirements, while eliminating the requirement for an additional mask to produce the desired results.

Figure 19:
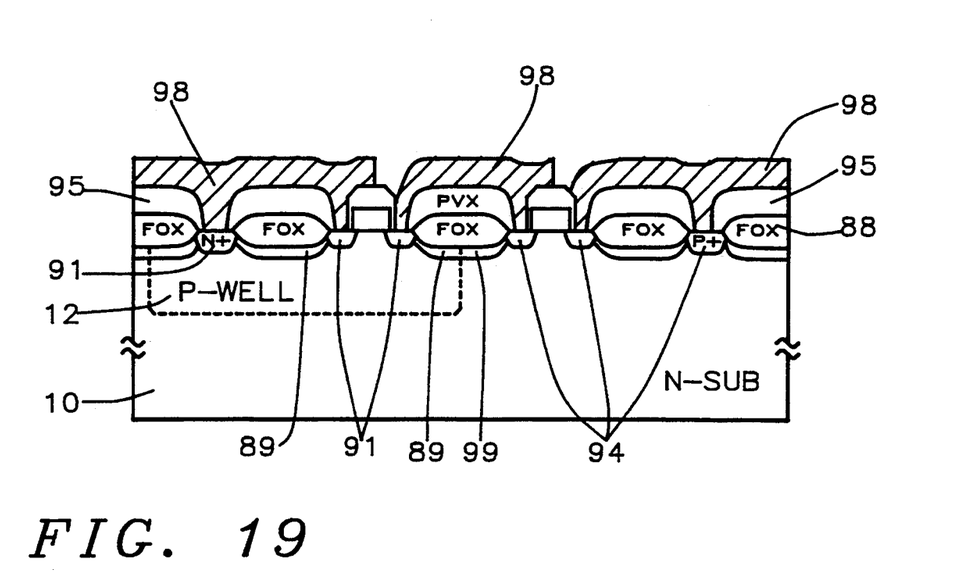
FIG. 19. shows a low voltage device in accordance with this invention wherein a substrate and a P−well have a CMOS device formed therein.

FIG. 19. shows a low voltage device in accordance with this invention wherein a substrate 10 and a P−well 12 have a CMOS device formed therein. The devices include the elements above where listed in the drawing plus P− field 89 and N− field 99.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A semiconductor device comprising
   a) a N−silicon substrate with an N− impurity,
   b) a P−well with a P− impurity,
   c) dopant ions of P− polarity in the surface of said substrate in a set of P− regions selected in said substrate and said well,
   d) dopant ions of an N− polarity implanted in N− regions between said P− regions in said well and on either side of said P− regions in said N−silicon substrate,
   e) field oxide structures over said P− and N− regions,
   f) gate oxide layers above the exposed portions of said N− silicon substrate and said P−well,
   g) conductive gate structures over said gate oxide layers between said N− regions in said well and between said P−regions in said N− substrate, and
   h) an implanted P− isolation region in said P−well and an implant of an N− isolation region in said N−substrate.

2. A device in accordance with claim 1 with said conductive gate structures extending over the top of said field oxide layers juxtaposed therewith.

3. A device in accordance with claim 2 with said conductive gate structures comprising polysilicon.

4. A device in accordance with claim 1 with an N− grade region formed after formation of said conductive gate structures.

5. A device in accordance with claim 4 with an N+ diffusion region formed after said N− grade region.

6. A device in accordance with claim 5 with a P+ diffusion formed after said N+ diffusion.

7. A device in accordance with claim 6 with a contact area formed down to said P+ diffusion.

8. A device in accordance with claim 7 with metal deposited into said contact area for electrical connection to said P+ diffusion.

9. A device in accordance with claim 7 with oxide deposited, with reflow and with densification performed after said P+ diffusion.

10. A device in accordance with claim 9 with a contact area formed down to said P+ diffusion, and metal deposited into said contact area for electrical connection to said P+ diffusion.

11. A semiconductor device fabricated by the method comprising
 a) applying an impurity of a N− polarity to a silicon substrate,
 b) forming a P− well by applying an impurity of P− polarity to a region in said silicon substrate,
 c) forming a first masking layer on the surface of said substrate,
 d) providing openings in said masking layer and implanting P− dopant ions into the surface of said substrate in a set of P− regions selected in said substrate and said well,
 e) forming a second masking layer on the surface of said substrate,
 f) implanting dopant ions of an N− polarity through a second mask in N− regions selected in said P− well and said substrate,
 g) removal of said second masking layer,
 h) formation of field oxide structures over said P− and N− regions,
 i) forming gate oxide layers above the exposed portions of said N−substrate and said P−well regions,
 j) formation of conductive gate structures over said gate oxide layers, and
 k) implanting a P− isolation region from about $3 \times 10^{13}/cm^2$ to about $9 \times 10^{13}/cm^2$ at an energy from about 20 keV to about 50 keV in said P−well and implanting an N− isolation region from about $1.5 \times 10^{12}/cm^2$ to about $5.5 \times 10^{12}/cm^2$ at an energy from about 120 keV to about 180 keV in said N−substrate.

12. A device in accordance with claim 11 wherein said conductive gate structures extend over the top of said field oxide layers juxtaposed therewith.

13. A device in accordance with claim 12 wherein said conductive gate structures comprise polysilicon.

14. A device in accordance with claim 11 wherein an N− grade region is formed after formation of said conductive gate structures from about $2 \times 10^{13}/cm^2$ to about $8 \times 10^{13}/cm^2$ at an energy from about 120 keV to about 180 keV in said P−well.

15. A device in accordance with claim 14 wherein an N+ diffusion region is formed after said N− grade region of arsenic from about $3 \times 10^{15}/cm^2$ to about $5 \times 10^{15}/cm^2$.

16. A device in accordance with claim 15 wherein a P+ diffusion from about $3 \times 10^{15}/cm^2$ to about $5 \times 10^{15}/cm^2$ at an energy from about 60 keV to about 120 keV in said P−well is formed after said N+ diffusion.

17. A device in accordance with claim 16 wherein a contact area is formed down to said P+ diffusion.

18. A device in accordance with claim 17 wherein metal is deposited into said contact area for electrical connection to said P+ diffusion.

19. A device in accordance with claim 17 wherein oxide is deposited, reflow is performed and densification is performed after said P+ diffusion.

20. A device in accordance with claim 19 wherein a contact area is formed down to said P+ diffusion, and metal is deposited into said contact area for electrical connection to said P+ diffusion.

21. A method of fabrication of an semiconductor device comprising
 a) applying an impurity of N− polarity to a silicon substrate,
 b) forming a P− well by applying an impurity of an opposite polarity to a region in said silicon substrate,
 c) forming a first masking layer on the surface of said substrate,
 d) providing openings in said masking layer and implanting P− dopant ions into the surface of said substrate in a set of P− regions selected in said substrate and said well
 e) forming a second masking layer on the surface of said substrate,
 f) implanting N− dopant ions of an N− polarity through a second mask in second regions selected in said P−well and said substrate,
 g) removal of said second masking layer,
 h) formation of field oxide structures over said first and second regions,
 i) forming gate oxide layers between said N− regions and said P− regions,
 j) formation of conductive gate structures over said gate oxide layers, and
 k) implanting a P− isolation region from about $3 \times 10^{13}/cm^2$ to about $9 \times 10^{13}/cm^2$ at an energy from about 20 keV to about 50 keV in said P−well and implanting an N− isolation region from about $1.5 \times 10^{12}/cm^2$ to about $5.5 \times 10^{12}/cm^2$ at an energy from about 120 keV to about 180 keV in said N−substrate.

22. A method in accordance with claim 21 wherein said conductive gate structures extend over the top of said field oxide layers juxtaposed therewith.

23. A method in accordance with claim 22 wherein said conductive gate structures comprise polysilicon.

24. A method in accordance with claim 21 wherein an N− grade region is formed after formation of said conductive gate structures from about $2 \times 10^{13}/cm^2$ to about $8 \times 10^{13}/cm^2$ at an energy from about 120 keV to about 180 keV in said P−well.

25. A method in accordance with claim 24 wherein an N+ diffusion region is formed after said N− grade region of arsenic from about $3 \times 10^{15}/cm^2$ to about $5 \times 10^{15}/cm^2$.

26. A method in accordance with claim 5 wherein a P+ diffusion from about $3 \times 10^{15}/cm^2$ to about $5 \times 10^{15}/cm^2$ at an energy from about 60 keV to about 120 keV in said P−well is formed after said N+ diffusion.

27. A method in accordance with claim 6 wherein a contact area is formed down to said P+ diffusion.

28. A method in accordance with claim 27 wherein metal is deposited into said contact area for electrical connection to said P+ diffusion.

29. A method in accordance with claim 27 wherein oxide is deposited, reflow is performed and densification is performed after said P+ diffusion.

30. A method in accordance with claim 29 wherein a contact area is formed down to said P+ diffusion, and metal is deposited into said contact area for electrical connection to said P+ diffusion.

31. A device in accordance with claim 1, wherein a low voltage implant of a P−field and an N−field produced a high voltage device region (P−drift, P−isolation, N−drift, N−isolation) for controlling the P− implant and the N− implant to meet high voltage device requirements, while eliminating the requirement for an additional mask to produce the desired results.

* * * * *